(12) United States Patent
Ory

(10) Patent No.: US 9,543,247 B1
(45) Date of Patent: Jan. 10, 2017

(54) SURFACE-MOUNT ELECTRONIC COMPONENT

(71) Applicant: STMicroelectronics (Tours) SAS, Tours (FR)

(72) Inventor: Olivier Ory, Tours (FR)

(73) Assignee: STMicroelectronics (Tours) SAS, Tours (FR)

(*) Notice: Subject to any disclaimer, the term of this patent is extended or adjusted under 35 U.S.C. 154(b) by 0 days.

(21) Appl. No.: 15/051,158

(22) Filed: Feb. 23, 2016

(30) Foreign Application Priority Data

Aug. 31, 2015 (FR) ...................................... 15 58067

(51) Int. Cl.
| | | |
|---|---|---|
| *H01L 23/52* | (2006.01) | |
| *H01L 29/06* | (2006.01) | |
| *H01L 29/16* | (2006.01) | |
| *H01L 23/528* | (2006.01) | |
| *H01L 21/306* | (2006.01) | |
| *H01L 21/304* | (2006.01) | |
| *H01L 21/302* | (2006.01) | |
| *H01L 21/768* | (2006.01) | |
| *H01L 21/78* | (2006.01) | |

(52) U.S. Cl.
CPC .......... *H01L 23/528* (2013.01); *H01L 21/302* (2013.01); *H01L 21/3043* (2013.01); *H01L 21/30604* (2013.01); *H01L 21/76843* (2013.01); *H01L 21/76879* (2013.01); *H01L 21/78* (2013.01); *H01L 29/0657* (2013.01); *H01L 29/16* (2013.01)

(58) Field of Classification Search
CPC ..... H01L 23/528; H01L 29/0657; H01L 29/16
See application file for complete search history.

(56) References Cited

U.S. PATENT DOCUMENTS

| | | | |
|---|---|---|---|
| 3,640,806 A | 2/1972 | Watanabe et al. | |
| 4,437,141 A | 3/1984 | Prokop | |
| 5,759,903 A * | 6/1998 | Lehmann | ............ H01L 21/3063 257/E21.216 |
| 5,765,280 A | 6/1998 | Joshi | |
| 5,963,433 A | 10/1999 | Kim | |
| 6,153,489 A * | 11/2000 | Park | ........................ H01L 28/10 257/E21.022 |

(Continued)

FOREIGN PATENT DOCUMENTS

| | | |
|---|---|---|
| JP | 10065298 | 3/1998 |
| JP | 11191562 | 7/1999 |

(Continued)

OTHER PUBLICATIONS

INPI Search Report and Written Opinion for FR 1558067 dated Apr. 28, 2016 (8 pages).

*Primary Examiner* — Ida M Soward
(74) *Attorney, Agent, or Firm* — Gardere Wynne Sewell, LLP

(57) ABSTRACT

A surface-mount chip is formed by a silicon substrate having a front surface and a side. The chip includes a metallization intended to be soldered to an external device. The metallization has a first portion covering at least a portion of the front surface of the substrate and a second portion covering at least a portion of the side of the substrate. A porous silicon region is included in the substrate to separating the second portion of the metallization from the rest of the substrate.

8 Claims, 5 Drawing Sheets

(56) References Cited

U.S. PATENT DOCUMENTS

| | | | |
|---|---|---|---|
| 6,608,366 B1 | 8/2003 | Fogelson et al. | |
| 6,909,166 B2 | 6/2005 | Frezza et al. | |
| 7,635,899 B2 * | 12/2009 | Yang | H01L 21/76227 257/371 |
| 7,759,129 B2 * | 7/2010 | Sailor | G01N 33/552 356/477 |
| 8,187,740 B2 * | 5/2012 | Nathan | H01M 2/0202 427/115 |
| 9,466,662 B2 * | 10/2016 | Gardner | H01L 28/90 |
| 2001/0044169 A1 | 11/2001 | Yasunaga et al. | |
| 2002/0060342 A1 | 5/2002 | Kobayakawa | |
| 2006/0197187 A1 | 9/2006 | Lohninger et al. | |
| 2010/0133693 A1 | 6/2010 | Arshad | |
| 2012/0034760 A1 | 2/2012 | Schuderer et al. | |
| 2012/0289023 A1 | 11/2012 | Ahrens et al. | |
| 2012/0289047 A1 | 11/2012 | Ahrens et al. | |
| 2016/0064499 A1 * | 3/2016 | Zan | H01L 29/4238 257/40 |
| 2016/0196932 A1 * | 7/2016 | Chiem | H01G 11/86 361/502 |
| 2016/0293547 A1 * | 10/2016 | Rha | H01L 21/306 |

FOREIGN PATENT DOCUMENTS

| | | |
|---|---|---|
| JP | 2956606 B2 | 10/1999 |
| JP | 2000294719 A | 10/2000 |

* cited by examiner

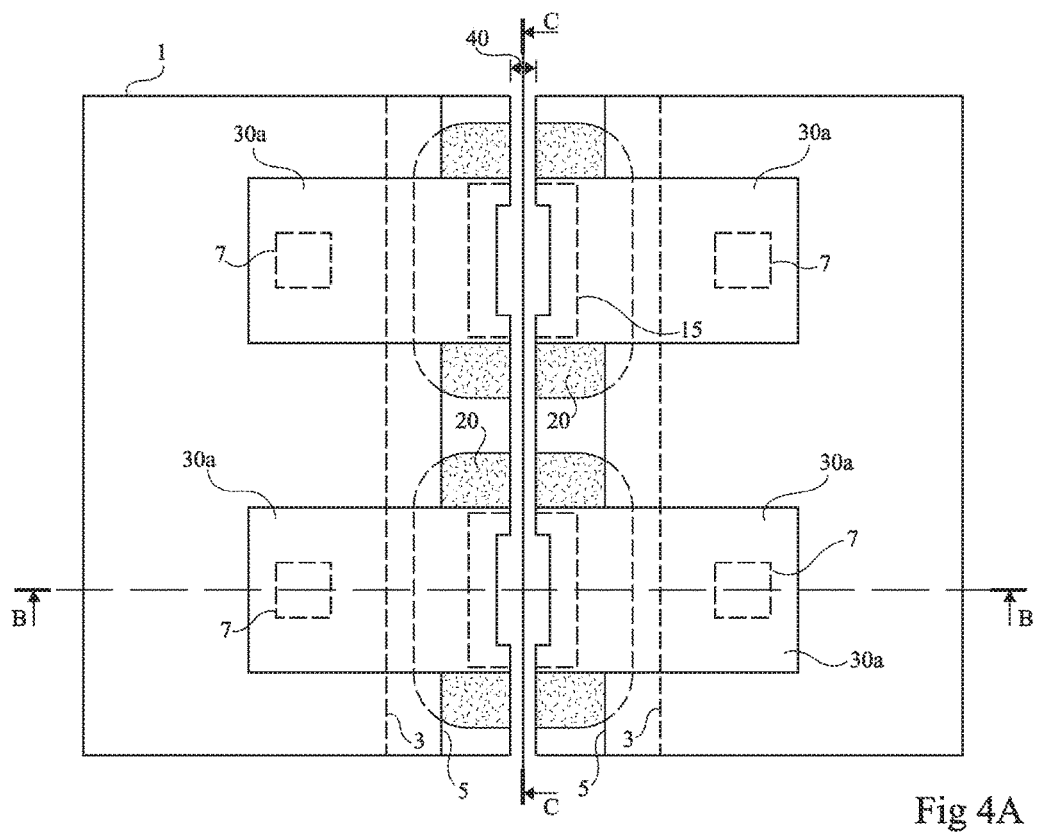
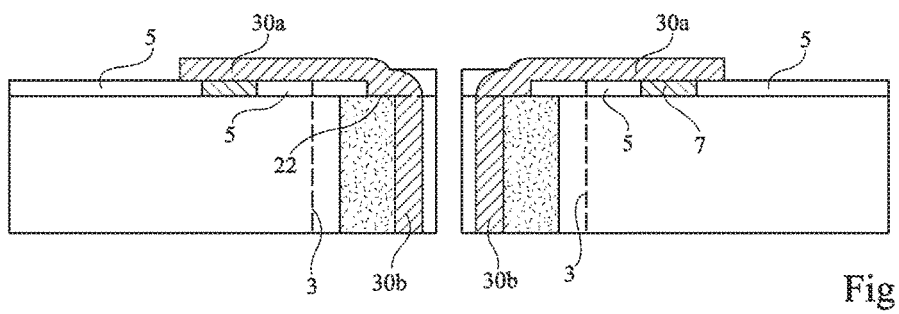
Fig 4A
Fig 4B

SURFACE-MOUNT ELECTRONIC COMPONENT

PRIORITY CLAIM

This application claims the priority benefit of French Application for Patent No. 1558067, filed on Aug. 31, 2015, the contents of which is hereby incorporated by reference in its entirety to the maximum extent allowable by law.

TECHNICAL FIELD

The present disclosure relates to the field of semiconductor chips. It more specifically aims at surface-mount chips, that is, chips comprising, on at least one surface, metallizations intended to be soldered to an external device, for example, a printed circuit or another chip.

BACKGROUND

In certain applications, there is a need for surface-mount chips where the metallizations intended to be soldered to an external device are continued by lateral portions on the chip sides. When the soldering is performed, part of the soldering material bonds to the lateral portions of the metallizations, which enables to visually inspect the quality of the connections. This need for example exists for sensitive fields such as the automobile field or the medical field.

An example of a method of forming a surface-mount chip comprising a metallization continuing on one side of the chip is described in United States Patent Application Publication No. 2012/0053760 (incorporated by reference). This method however has disadvantages and particularly raises practical implementation issues.

SUMMARY

Thus, an embodiment provides a surface-mount chip formed inside and on top of a silicon substrate having a front surface and a side, the chip comprising: at least one metallization intended to be soldered to an external device, this metallization comprising a first portion covering at least a portion of the front surface of the substrate, and a second portion covering at least a portion of the side of the substrate; and a porous silicon region, included in the substrate, separating the second portion of the metallization from the rest of the substrate.

According to an embodiment, the second portion of the metallization is arranged in a groove located on the side of the substrate.

According to an embodiment, the chip further comprises: an active area formed inside and on top of the substrate and containing an electronic circuit; and at least one contact region connected to the electronic circuit and located on the front surface of the chip, wherein the first portion of the metallization is connected to the contact region.

According to an embodiment, an insulating layer is arranged between the front surface of the substrate and the first portion of the metallization.

According to an embodiment, the porous silicon region is in contact with the insulating layer in an overlap area.

Another embodiment provides a method of forming a surface-mount chip inside and on top of a silicon substrate, the method comprising the steps of: a) etching an opening from the upper surface of the substrate, this opening defining a portion of a side of the chip; b) forming a porous silicon region extending in the substrate from the lateral walls of the opening; and c) forming a metallization intended to be soldered to an external device, this metallization comprising a first portion covering at least a portion of the upper surface of the substrate, and continuing in a second portion extending over at least a portion of a lateral wall of the opening.

According to an embodiment, the method further comprises, after step c), a step of cutting along a cutting line crossing the opening.

According to an embodiment, during the cutting step, the cutting area has a width smaller than the width of the openings.

According to an embodiment, the method comprises a step of grinding the lower surface of the substrate.

According to an embodiment, at step c), the forming of the metallization comprises an electrochemical deposition step.

BRIEF DESCRIPTION OF THE DRAWINGS

The foregoing and other features and advantages will be discussed in detail in the following non-limiting description of specific embodiments in connection with the accompanying drawings, wherein:

FIGS. 1A, 1B, 2A, 2B, 3A, 3B, 4A, 4B, and 4C schematically show steps of an embodiment of a surface-mount chip manufacturing method.

DETAILED DESCRIPTION

Figure 1A:
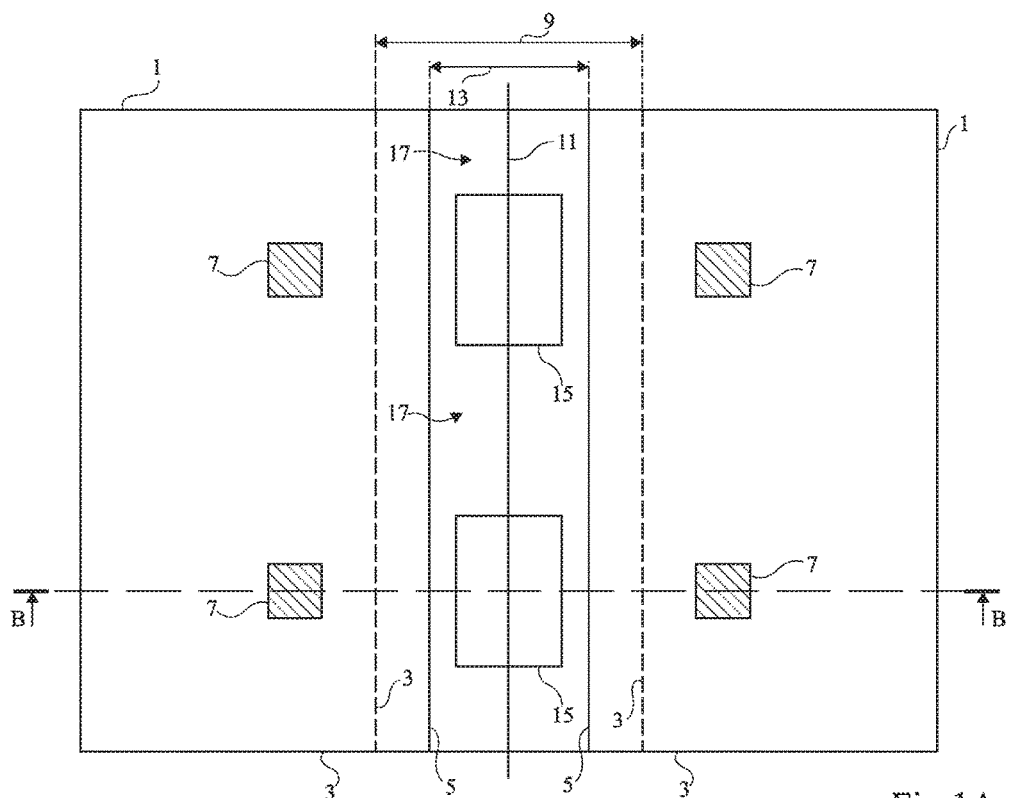

The same elements have been designated with the same reference numerals in the different drawings and, further, the various drawings are not to scale.

In the following description, when reference is made to terms qualifying absolute positions, such as terms "left", "right", etc., or relative positions, such as terms "above", "under", "upper", "lower", etc., or to terms qualifying directions, such as terms "horizontal", "vertical", etc., it is referred to the orientation of the cross-section views of FIGS. 1B, 2B, 3B, 4B, it being understood that, in practice, the described devices may be oriented differently. Unless otherwise specified, expressions "approximately", "substantially", and "in the order of" mean to within 10%, preferably to within 5%, or, relating to orientation qualifiers, to within 10 degrees, preferably to within 5 degrees.

Figure 1B:
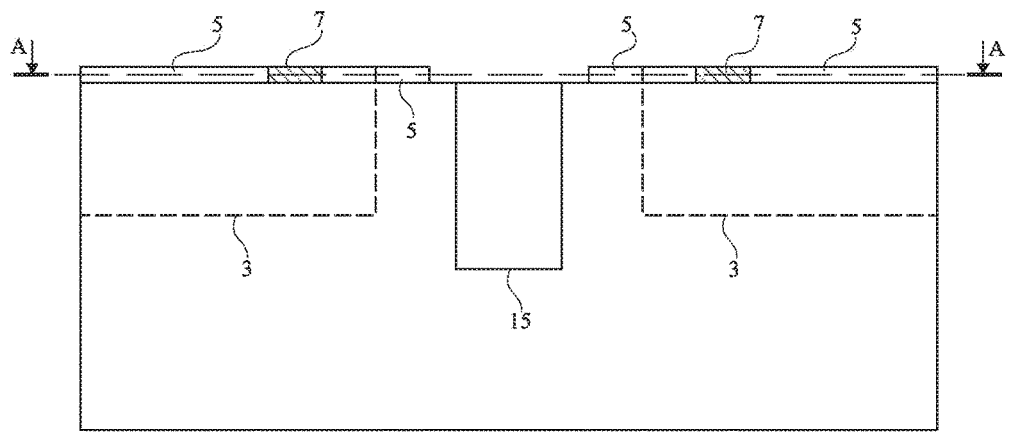
Figure 2A:
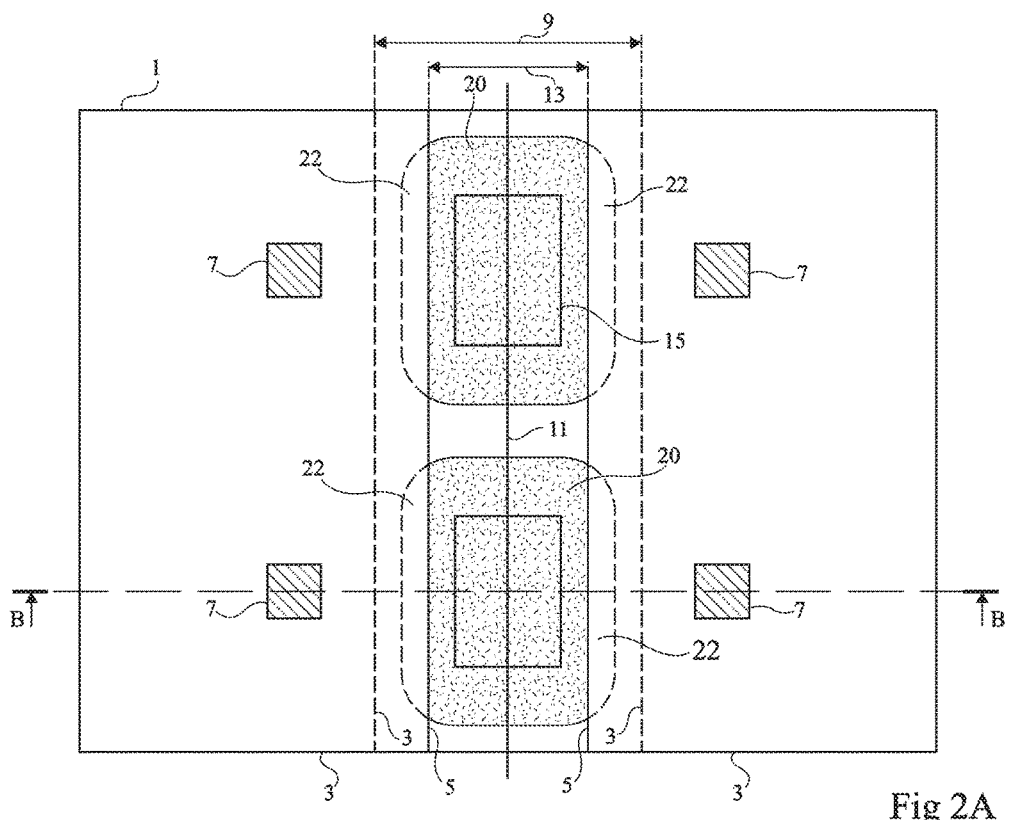
Figure 2B:
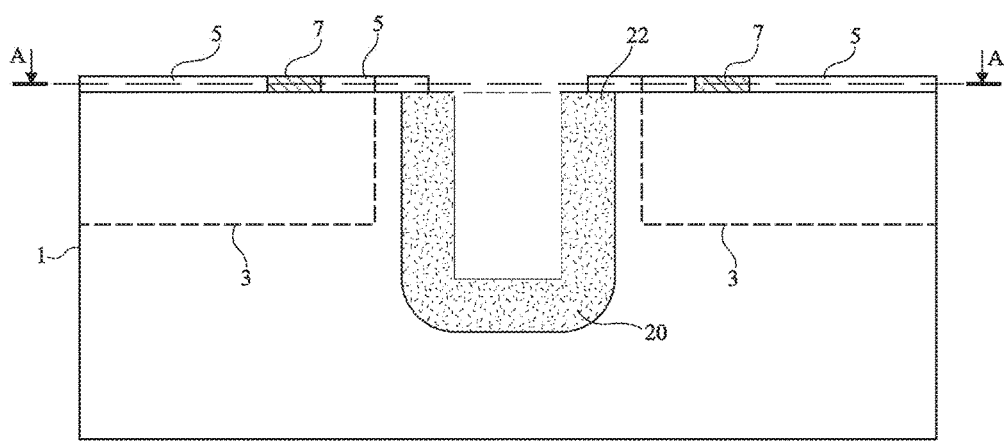
Figure 3A:
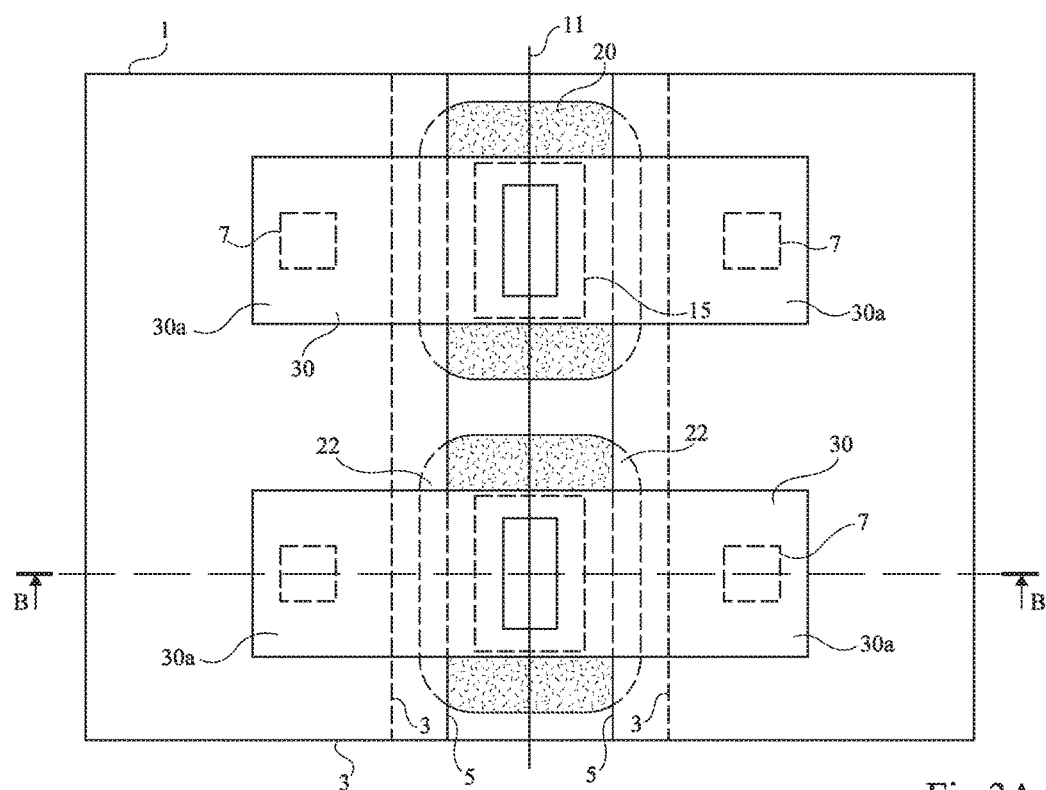
Figure 3B:
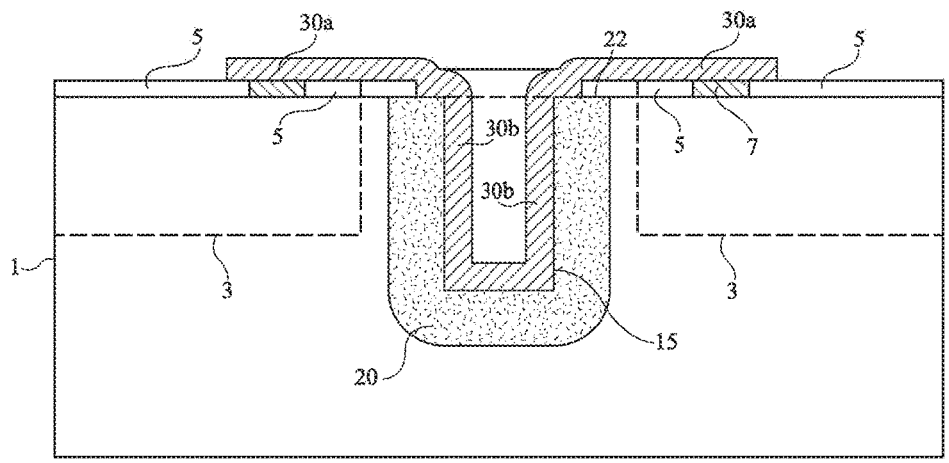
Figure 4C:
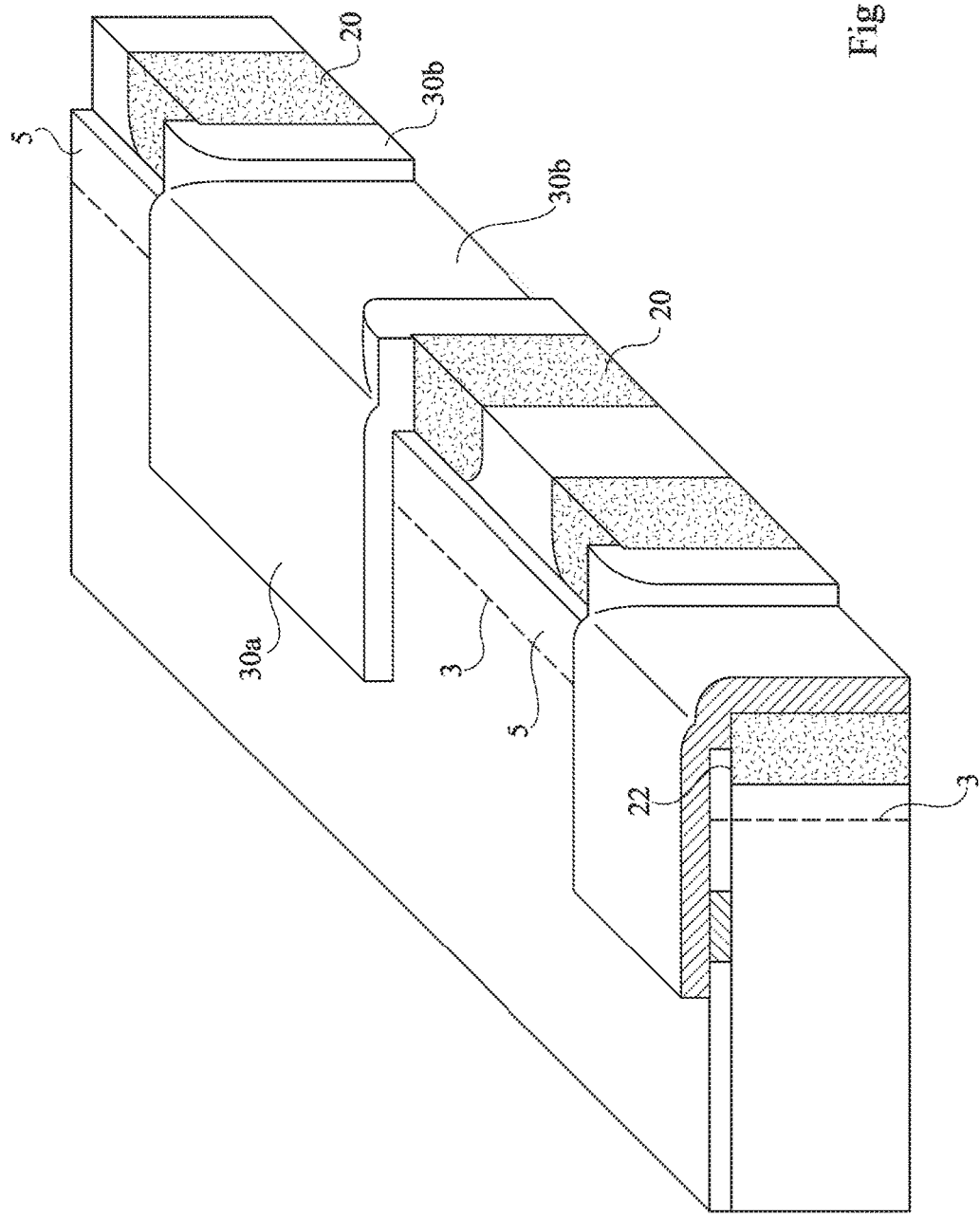

FIGS. 1A, 1B, 2A, 2B, 3A, 3B, 4A, 4B, and 4C schematically show steps of an embodiment of a surface-mount chip manufacturing method. FIGS. 1B, 2B, 3B, 4B are cross-section views along plane B-B of FIGS. 1A, 2A, 3A, 4A. FIGS. 1A and 2A are cross-section views along plane A-A of FIGS. 1B and 2B. FIGS. 3A and 4A are top views. FIG. 4C is a perspective view, cut according to planes B-B and C-C of FIG. 4A.

The steps described hereafter relate to the simultaneous forming of a plurality of chips, for example, identical, from a same silicon substrate 1. For simplification, only two portions of two neighboring chips are shown in the drawings, these portions being opposite each other respectively in a left-hand portion and in a right-hand portion of the drawings. Each of the chips comprises, inside and on top of substrate 1, an active area 3 having an electronic circuit comprising one or a plurality of semiconductor components (not shown) formed therein. The upper surface of active area 3 is integrally covered with an insulating layer 5, except for one or a plurality of contact regions 7 connected to the electronic circuit. The steps described hereafter more specifically concern the forming, in each chip, of at least one metallization intended to be soldered to an external device, this metallization comprising an upper portion in contact with one or a plurality of contact regions 7 of the chip, and a lateral portion on a side of the chip.

FIGS. 1A and 1B show a step where it is started from substrate wafer 1, inside and on top of which active areas 3, insulating layer 5, and contact regions 7 have been previously formed. At this stage, the cutting of the substrate wafer into individual chips has not occurred yet. The active areas 3 of neighboring chips are separated, in top view, by spacing areas 9, each of which having a cutting line 11 defined inside thereof. In the drawings, only a portion of the strip for the spacing area 9 and a corresponding portion of the cutting line 11 are shown.

In the shown example, in a strip 13, included in spacing area 9 and containing cutting line 11, insulating layer 5 is removed, leaving the surface of substrate 1 exposed. In this example, the width of strip 13 is smaller than the width of spacing area 9 and, in top view, strip 13 is strictly comprised within spacing area 9, that is, the edges of strip 13 are distant from the edges of spacing area 9. Thus, on each side of strip 13, insulating layer 5 covers substrate 1 in a portion of spacing area 9.

In a portion of strip 13 located between two neighboring chips, one or a plurality of local openings 15 are etched in substrate 1, from the upper surface of the substrate. In top view, each opening 15 is crossed by cutting line 11 included in strip 13. The dimension of the chips in the direction of cutting line 11 is greater than the sum of the dimensions of openings 15 along the cutting line. In other words, at least one unetched space 17 is maintained in strip 13 between the chips along cutting line 11.

In the shown example, two openings 15 can be seen, each being located between a contact region 7 of the chip located in the left-hand portion of the drawings and a contact region 7 of the chip located in the right-hand portion of the drawings. In the shown example, openings 15 have, in top view, the shape of rectangles, even though other shapes are possible. In this example, openings 15 extend, vertically, down to a depth greater than the thickness of substrate 1 occupied by active portions 3. In this example, openings 15 are not through openings but rather are blind openings, that is, they extend, vertically, down to a depth smaller than the thickness of substrate 1. As a variation, openings 15 may be through openings.

Openings 15 may be formed by a plasma etching method, for example, by a RIE-type etching ("Reactive Ion Etching"). More generally, any other method enabling to form local openings in the strips 13 may be used, for example, a chemical or laser etching.

FIGS. 2A and 2B show a step where, after the step shown in FIGS. 1A and 1B, porous silicon regions 20 are formed in substrate 1 from the lateral walls and the bottom of openings 15. In top view, porous silicon regions 20 are comprised within spacing area 9. More particularly, in top view, each opening 15 is surrounded with a porous silicon region 20, which extends from the lateral walls of opening 15 all the way into portions of substrate 1 located under insulating layer 5. Thus in overlap areas 22, portions of porous silicon regions 20 have their upper surfaces in contact with the lower surface of insulating layer 5. In the shown example, the bottom and the lateral walls of each opening 15 are totally surrounded with a porous silicon region 20, so that opening 15 is insulated from the rest of the substrate by region 20. In this example, overlap areas 22 are present on either side of cutting line 11 at the level of each opening 15.

Porous silicon regions 20 may be formed, for example, by an electrochemical dissolution method. To achieve this, a mask which covers the upper surface of the assembly of FIGS. 1A and 1B except for openings 15 may be formed. The assembly may then be plunged into a hydrofluoric acid solution between a first electrode opposite the lower surface of the assembly, and a second electrode opposite the upper surface of the assembly. The flowing of a current and a possible lighting with an appropriate wavelength, are set to cause, at the level of the lateral walls and of the bottom of openings 15, the dissolution of a portion of the silicon of substrate 1. Thereby, at the level of each opening 15, a substrate region 1 surrounding opening 15 is turned into porous silicon. In the shown example, the porous silicon regions 20 associated with the different openings 15 are separate. As a variation, a continuous porous silicon region extending, in top view, over the entire surface of strip 13, may be formed, this region continuing under insulating layer 5 at the level of overlap areas 22.

Once porous silicon regions 20 have been formed, a porous silicon oxidation step may be provided, for example, by thermal oxidation. The oxidation of the porous silicon enables to increase the insulating properties of regions 20. Such an oxidation step is however optional.

FIGS. 3A and 3B show a step where, after the step shown in FIGS. 2A and 2B, metallizations 30 intended to be soldered to an external device are formed. Each metallization 30 comprises at least one upper portion 30a covering a portion of the upper surface or front surface of at least one of the chips formed inside and on top of substrate 1, and a lateral portion 30b covering at least a portion of a lateral wall of an opening 15 bordering the chip. On each chip, at least one contact region 7 of the chip is in contact with an upper portion 30a of a metallization 30.

In the shown example, for each of openings 15, a metallization 30 is formed, metallization 30 covering the lateral walls and the bottom of opening 15, and extending in a first upper portion 30a on the upper surface of the chip located in the left-hand portion of the drawing, and in a second upper portion 30a on the upper surface of the chip located in the right-hand portion of the drawing. In the shown example, each metallization 30 has its first upper portion 30a in contact with a contact region 7 of the chip located in the left-hand portion of the drawing, and its second upper portion 30a in contact with a contact region 7 of the chip located in the right-hand portion of the drawing.

Metallizations 30 are for example formed by an electrochemical deposition method. To achieve this, a mask, not shown, may be formed, this mask covering the entire upper surface of the assembly of FIGS. 2A and 2B except for the locations where the metallizations should be deposited. A seed layer may then be deposited, for example, by a sputtering method. Once the seed layer has been deposited, an electrochemical deposition may be carried out from this seed layer, to form metallizations 30. As a variation, a plurality of successive electrochemical depositions may be successively carried out to obtain metallizations 30 comprising a plurality of layers of different metals. More generally, any other adapted deposition method may be used to form metallizations 30.

FIGS. 4A, 4B, and 4C show a step where, after the step shown in FIGS. 3A and 3B, substrate 1 is cut into individual chips along each of cutting lines 11, for example by sawing, by laser or chemical cutting, by cleaving, or by any other adapted cutting method. In top view, a cutting strip or area 40 centered on cutting line 11 is removed between two neighboring chips to dissociate the chips. The width of openings 15 is greater than the width of cutting strip 40. More particularly, the width of openings 15 is selected so that lateral portions 30b of metallizations 30 located on the chip sides are not removed during the cutting. To achieve this, in the shown example, width $L_{15}$ of openings 15 is such that $L_{15}-2*e_{30b}>L_{40}$, $e_{30b}$ being the thickness of lateral portions 30b of metallizations 30, and $L_{40}$ being the width of strip 40.

In the shown example, before the actual cutting step, a prior step of grinding the lower surface or rear surface of substrate 1 is carried out. During the grinding step, a portion of substrate 1 is removed from the entire surface of the assembly from the lower surface of substrate 1. The grinding is interrupted before reaching active areas 3. The grinding is for example interrupted at a level intermediate between the upper surface of metallization portions 30 coating the bottom of openings 15 and the lower surface of active areas 3. Thus, at the end of the grinding step, openings 15 emerge on the rear surface of substrate 1. As a variation, the grinding may be interrupted before reaching the bottom of openings 15. In another variation, the grinding step may be omitted.

After the cutting, each of the chips comprises at least one metallization 30 having an upper portion 30a covering a portion of the upper surface of the chip, and having a lateral portion 30b covering a portion of a side of the chip, at least one region 7 of the chip being in contact with an upper portion 30a of a metallization 30. Each metallization 30 has its lateral portion 30b insulated from the rest of substrate 1 by a porous silicon region 20. The insulation of upper portions 30a of metallizations 30 is ensured, in particular, by insulating layer 5. Overlap areas 22 ensure the continuity of the insulation between the insulation by insulating layer 5 and the insulation by porous silicon regions 20.

Each metallization 30 is for example formed of a copper layer covered with a tin layer.

As an example, openings 15 have a width in the range from 50 μm to 100 μm, the metallizations have a thickness in the range from 0.8 μm to 6 μm, and cutting strips 40 have a width in the range from 10 μm to 30 μm. Porous silicon regions 20 for example have a thickness in the range from 10 to 50 μm.

An advantage of the method described hereabove is that it provides chips having, on their front surface, metallizations 30 intended to be soldered to an external device, with metallizations 30 extending on a portion of the chip sides, which enables to visually inspect the quality of the connections.

Another advantage of the chips thus obtained is that the insulation between lateral portions 30b of metallizations 30 and substrate 1 is achieved by porous silicon regions 20 formed in substrate 1. It is thus possible to easily adapt the insulation thickness according to the needs of the application. In particular, porous silicon regions 20 of significant thickness, for example, greater than 10 μm, may easily be formed, which especially enables to decrease capacitive couplings between metallizations 30 and substrate 1. The presence of porous silicon regions 20 of significant thickness further enables to limit the risk of short-circuit between a metallization 30 and substrate 1 during the cutting step.

Another advantage of chips obtained by the above-described method is that, due to fact that the width of openings 15 is greater than the width of cutting strip 40, lateral portions 30b of metallizations 30 may have recessed shapes. More specifically, in the shown example, lateral portions 30b of metallizations 30 have the shape of vertical channels arranged in vertical grooves located on the chip sides. This geometry enables to improve the bonding of the solder material to the chip sides. Further, such a geometry enables to make the visual control of the soldering easier. Further, this geometry enables to locate the soldering material inside of the vertical channels, thus limiting the risk of short-circuit between neighboring metallizations 30.

Another advantage of the above-described method is that the unetched spaces 17, maintained between the chips along cutting line 11 during the step described in relation with FIGS. 1A and 1B, may receive elements useful to the chip manufacturing, such as, for example, alignment marks enabling to ease the positioning of the substrate during the different steps of the method, etch control elements, or electric control elements.

Specific embodiments have been described. Various alterations, modifications, and improvements will occur to those skilled in the art. In particular, the step described in relation with FIGS. 1A and 1B of removing insulating layer 5 in a strip 13 extending on either side of cutting line 11, is optional. As a variation, insulating layer 5 may be kept in layer 13, and openings 15 may be formed from the upper surface of insulating layer 5.

Further, the described embodiments are not limited to the example described in relation with FIGS. 1A and 1B where openings 15 vertically extend down to a depth greater than the thickness of active areas 3 and smaller than the thickness of substrate 1. As a variation, openings 15 formed at the step described in relation with FIGS. 1A and 1B may have a depth smaller than the thickness of active areas 3 or may thoroughly cross substrate 1.

Further, the described embodiments are not limited to the above-mentioned examples where only the upper surface of substrate 1 supports metallizations extending on the substrate sides. As a variation, each of the upper and lower surfaces of the substrate may be provided with metallizations extending on the substrate sides.

As an example, lower surface metallizations and upper surface metallizations may be connected by metallization portions located on the sides of the substrate. When the electronic circuit of the chip has contact regions on the lower surface of the substrate, for example, contacts with components having a vertical operation, the contact may thereby be transferred to upper surface metallizations intended to be soldered to an external device. The upper surface contacts may also be transferred in this manner towards lower surface metallizations intended to be soldered, for example, to another chip.

As a variation, the lower surface metallizations may be independent from the upper surface metallizations, that is, not connected to upper surface metallizations.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A surface-mount integrated circuit chip, comprising:
   a substrate having a front surface and a side;
   at least one metallization configured to be soldered to an external device, said at least one metallization comprising a first portion covering at least a portion of the front surface of the substrate and a second portion covering at least a portion of the side of the substrate; and
   a porous silicon region included in the substrate and separating the second portion of the metallization from a remainder of the substrate.

2. The chip of claim 1, wherein the second portion of the at least one metallization is arranged in a groove located on the side of the substrate.

3. The chip of claim 1, further comprising:
an active area formed inside and on top of the remainder of the substrate and containing an electronic circuit; and
at least one contact region connected to the electronic circuit and located on the front surface of the substrate, wherein the first portion of the at least one metallization is connected to the at least one contact region.

4. The chip of claim 1, wherein an insulating layer is arranged between the front surface of the substrate and the first portion of the at least one metallization.

5. The chip of claim 4, wherein the porous silicon region is in contact with the insulating layer in an overlap area.

6. An integrated circuit chip, comprising:
a semiconductor substrate including an active area with circuits;
a metal contact over the semiconductor substrate and in electrical connection with the circuits of the active area;
a porous silicon region of the semiconductor substrate along a side edge of the semiconductor substrate; and
a metal layer having a first portion in contact with the metal contact and having a second portion extending from the first portion onto the side edge of the semiconductor substrate and in contact with the porous silicon region.

7. The chip of claim 6, further comprising an insulating layer on top of the semiconductor substrate and surrounding the metal contact, wherein said first portion of the metal layer extends over the insulating layer.

8. The chip of claim 7, wherein a portion of the porous silicon region extends under a peripheral edge of the insulating layer.

* * * * *